United States Patent [19]

Osswald

[11] Patent Number: 4,770,196
[45] Date of Patent: Sep. 13, 1988

[54] CHEMICAL CLEANING SYSTEM

[76] Inventor: Hannes E. Osswald, 911 Indian Springs Rd., Crawfordsville, Ind. 47933

[21] Appl. No.: 829,440

[22] Filed: Feb. 13, 1986

[51] Int. Cl.⁴ .............................................. B08B 3/08
[52] U.S. Cl. .................................... 134/104; 134/111; 134/94; 134/166 R
[58] Field of Search ............ 134/94, 95, 96, 98, 134/104, 166 R, 111

[56] References Cited

U.S. PATENT DOCUMENTS

| | | |
|---|---|---|
| 2,239,452 | 4/1941 | Williams et al. |
| 3,046,163 | 7/1962 | Kearney et al. ................. 134/99 X |
| 3,400,687 | 9/1968 | Lueck . |
| 3,435,834 | 4/1969 | Cooper ................................ 134/98 |
| 4,138,306 | 2/1979 | Niwa . |
| 4,173,493 | 11/1979 | Kallas ............................ 134/104 X |
| 4,311,735 | 1/1982 | Young . |
| 4,361,418 | 11/1982 | Tscheppe . |
| 4,407,316 | 10/1983 | Ihringer ............................ 134/104 |
| 4,409,999 | 10/1983 | Pedziwiatr ......................... 134/95 |
| 4,530,131 | 7/1987 | Zell ................................. 134/166 X |
| 4,660,585 | 4/1987 | Schoenhard ........................ 134/96 |

FOREIGN PATENT DOCUMENTS 2821131 11/1979 Fed. Rep. of Germany .

*Primary Examiner*—Harvey C. Hornsby
*Assistant Examiner*—Frankie L. Stinson
*Attorney, Agent, or Firm*—Woodard, Emhardt, Naughton, Moriarty & McNett

[57] ABSTRACT

A vacuum metallizing chamber cleaning procedure isolates the vacuum pumping system from the chamber, closes the chamber, sprays the interior of the closed chamber with water, then sprays the chamber with a caustic solution for a predetermined period dissolving aluminum deposits, then sprays with a neutralizer, and then sprays to rinse with water. Hydrogen is exhausted outside the building. The chamber is constantly drained during spraying. Caustic and neutralizer are recirculated. The sludge generated and removed during the cleaning operation is pumped from the bottom of a caustic holding tank to a settling tank for settling and subsequent re-use of the clear caustic solution.

8 Claims, 1 Drawing Sheet

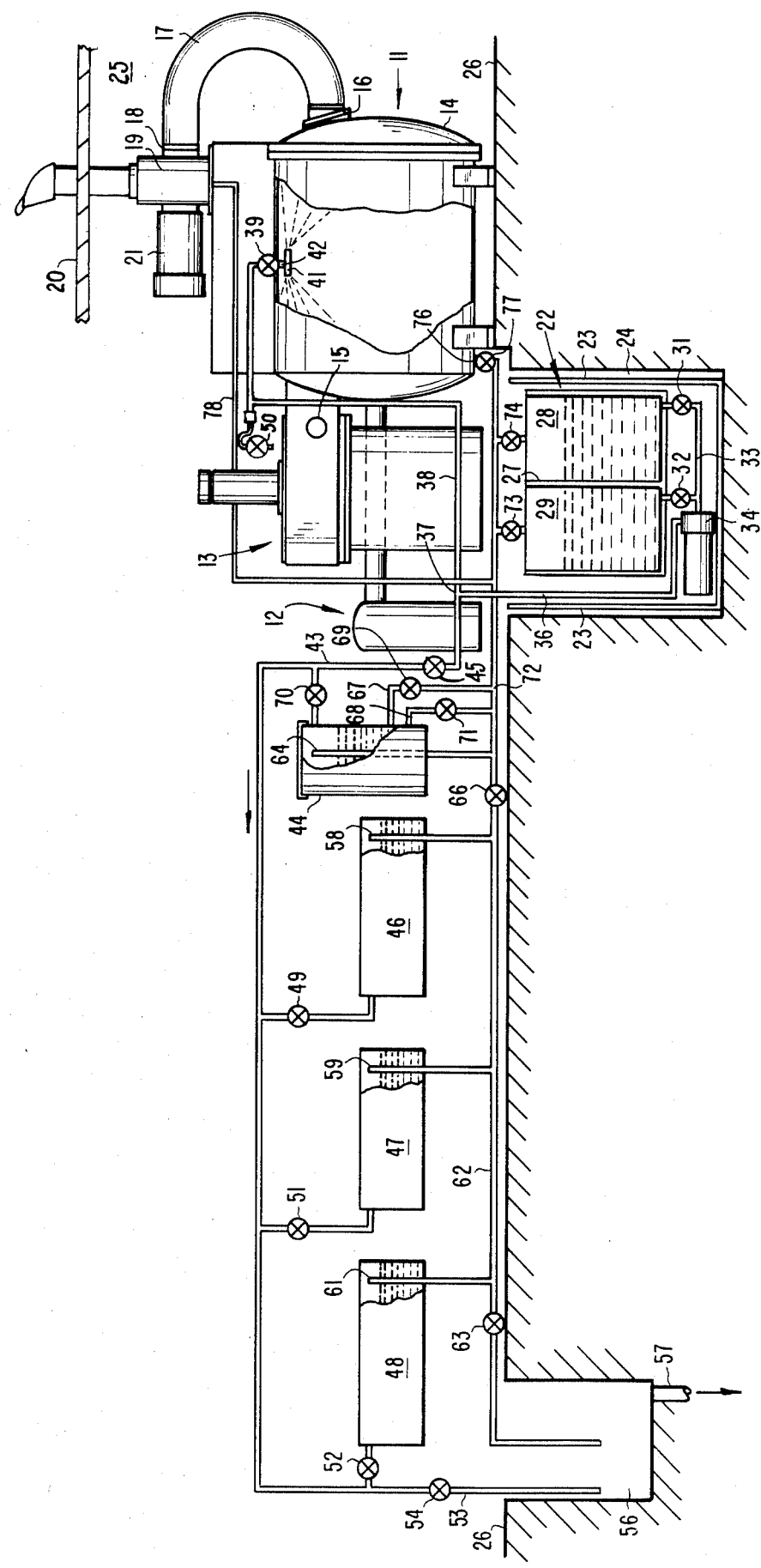

CHEMICAL CLEANING SYSTEM

BACKGROUND OF THE INVENTION

This invention relates generally to vacuum depositions and more particularly to vacuum metallizing processes and methods for cleaning deposits from the metallizing chamber.

DESCRIPTION OF THE PRIOR ART

In the art of vacuum metallizing, there are accumulations of materials deposited on the interior of the vacuum chamber and on the rotary reel frame, carriage mounting bars and other fixtures and accessories that are used in the chamber during the vacuum metallizing procedure. These deposits are somewhat porous and, as they become thicker, they make it increasingly difficult to pump down the chamber, so they must be removed. Removal has been a problem because it has required manual chipping and scraping and wire brushing and the use of caustic materials applied with sponges, mops, brushes or other applicators, in the chamber itself. Such procedures require many man hours, subject the equipment to damage and expose the cleaning personnel to the significant hazard of the caustic materials, particularly where aluminum deposits are to be removed. In addition to the man-hour reguirement, the chamber down time is lost.

Removal of deposits have been such a problem, that significant efforts have been made to avoid accumulations on the chamber wall. Types of shields strategically located to inhibit accumulation of deposits, have been devised. U.S. Pat. Nos. 3,400,687 and 2,239,452 are examples. The West German Offenlegungsschrift No. 2821131 is another. Possibly there are others. But these schemes require space inside the chamber, and must be removed themselves for cleaning. Besides, I do not believe that they totally avoid accumulations in the chamber itself.

A U.S. Pat. No. 4,138,306 to Niwa discloses apparatus for vapor phase reaction of semiconductor substrates. It has means for removing reaction material deposits from the heating table and from the inner walls of the reaction chamber by plasma etching, using microwave power to activate a suitable gas (such as a mix of freon and oxygen) for generating the plasma, and using evacuation means to remove the gases. It is not a metallizer, and the chamber may be relatively small.

A U.S. Pat. No. 4,311,735 to Young discloses apparatus for liquid impregnation of porous articles. It has a vacuum chamber wherein the air is withdrawn from the pores of the article, followed by introduction and covering of the article by liquid impregnant, and then release of vacuum to cause the impregnation. Washing fluid is then supplied to the vessel to wash excess impregnant from the surface of the article, and the fluid is removed from the vessel. Then the article is heated while still in the vessel, to cure the impregnant in the pores.

A U.S. Pat. No. 4,361,418 to Tscheppe deals with the problem of pump down during high humidity conditions in high vacuum pump systems, but does not deal with cleaning deposits from the chamber. Thus, I am not aware of any suitable cleaning system or apparatus for vacuum metallizers prior to my invention.

SUMMARY OF THE INVENTION

Described briefly, according to a typical embodiment of the present invention, a vacuum metallizing chamber is cleaned by a procedure which isolates the high vacuum pumping system from the chamber, closes the chamber, sprays the interior of the closed chamber with water, then sprays the chamber with a caustic solution for a predetermined period, then sprays with a neutralizer, and then sprays to rinse with water. Each spraying step thoroughly drenches the entire interior of the chamber. During the process, all generated hydrogen is exhausted outside the building. Also, the chamber is constantly drained during spraying. After the rinse, the chamber is opened. Any wet spots are dried manually with rags, mops, sponges, or electrically-powered vacuum cleaning machines, so all liquid is removed. The sludge generated and removed during the cleaning operation is pumped to a settling tank where it settles. Subsequent re-use of the clear caustic solution is possible.

BRIEF DESCRIPTION OF THE DRAWINGS

The single FIGURE of drawing is a schematic diagram of the cleaning system employed according to a typical embodiment of the present invention.

DESCRIPTION OF THE PREFERRED EMBODIMENT

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to the drawing in detail, a vacuum metallizing system itself is shown to include the vacuum chamber 11, roughing pumps 12, and diffusion pump 13. These are connected together in conventional manner. An example of the vacuum chamber is a Stokes Pennwalt Model 900-427-7, 72 inch I.D. 80 inches long, vacuum metallizer with a 35 inch diffusion pump by Varian. The chamber door 14 is at one end, and a conventional air valve 15 is at the other. The door has a nine inch diameter observation window fitting 16 therein. In the normal use of the equipment for the metallizing process, the observation window is in place in this fitting. For cleaning purposes, according to one feature of the present invention, the window is removed, and a hose 17 is connected to this fitting 16 and to the inlet 18 of an exhaus blower 19 driven by motor 21 and discharging through roof 20 to the outdoors.

According to one aspect of the present invention, a storage tank body 22 is received in a framework 23 in a pit 24 below the floor 26 of the room 25. This tank has a divider 27 dividing it into tanks 28 and 29. A caustic solution is stored in tank 29 and a neutralizer solution stored in tank 28. Each of these tanks has a drain outlet, with valve 31 and valve 32 on tanks 28 and 29, respectively. These drain to a line 33 connected to the intake of pump 34. The pump discharge line is at 36. There is a tee 37. The pump line branches at tee 37 into branch 38 which enters a valve 39 at the top of the vacuum chamber 11. A spray head 41 is mounted to a pipe nipple 42 welded into the top of the chamber and to which the valve 39 is connected outside the chamber.

The other branch 43 from the tee 37 in the pump line has valve 45 therein which, when opened, enables pump 34 to deliver to a settling tank 44 and three open-topped immersion cleaning tanks 46, 47 and 48. Valves 49, 51 and 52 are in the branches from line 43 to the tanks 46, 47 and 48, respectively and valve 70 is in the branch to the settling tank. A discharge line 53 downstream of valve 54 is directed into a pit 56 which may be a sump or have an outlet 57 to the sewer. If it is below sewer level, a sump pump may be installed in the pit.

Each of the immersion tanks has an open-topped overflow pipe, such as 58, 59 and 61 in the tanks 46, 47 and 48, respectively. Each of these pipes is connected to a drain line 62 which drains into the pit 56. A valve 63 is provided ahead of the discharge outlet into the pit.

An open-topped overflow pipe 64 is located in the settling tank 44. Its lower end is connected to the drain line 62, but through a valve 66. Outlets are provided at 67 and 68 at different levels above the bottom of the settling tank. Valves 69 and 71 are connected in these lines and to the drain line portion 72 upstream of valve 66. The drain line 72 also has outlets through valves 73 and 74 into the caustic tank 29 and neutralizer tank 28, respectively.

A three inch diameter drain opening is provided at 76 in the bottom of the vacuum chamber, according to the present invention, and has a valve 77 in it. The outlet of the valve is connected to the drain line portion 72. An additional drain line 78 is connected from the bottom of the hydrogen evacuating blower 19 to the drain line 72.

As an example, the various tanks are made of polypropylene with a ½ inch wall. The pit 24 is beside the metallizer so the frame 23 can be lifted out of the pit by a fork lift truck and placed on the floor to service the pump, if needed. The valves under the tank are shown only schematically but, actually have operating stems (not shown) extending up to floor level so they can be manually operated from above when the tank is in the pit. The polypropylene wall of settling tank 44 is translucent. This enables observation of the sludge level, and determination of when the lower tap can no longer be used. The supply and drain lines for the various components are provided with suitable pipe unions (not shown) facilitating disconnection, when desired, to manually dump the tanks if desired for servicing, or for replacement.

In the operation of the system, following the deposit of aluminum on the articles to be plated in the metallizer, the vacuum is released in the usual manner, the chamber door opened, and the articles are removed. If the chamber is to be cleaned according to the system of the present invention, carriages, reels, and all accessories may be removed from the chamber. The door 14 is closed and latched. A pair of C-clamps may be applied at the bottom of the door to add an additional measure of sealing at that location, since the procedure is done at atmospheric pressure.

The observation window is removed and the hose 17 is connected. Various holes, such as the diffusion pump opening and the roughing pump opening are plugged with manually expandable elastomeric plugs. The liquid distributor head 41 is mounted to the nipple 42. The head 41 is preferably a spray head and may be a short length of pipe, capped at both ends, and with a plurality of holes drilled in it or it can be a pipe cap screwed onto the nipple and drilled with a plurality of holes. In either case, the holes are drilled to provide the desired spray pattern to cover the entire interior of the chamber.

Valve 77 is opened and valve 39 is opened. Valves 66 and 63 are open. Valve 73 is opened and valve 74 is closed. Valve 31 is closed. Valve 45 is closed.

City water is turned on into the branch 38 by the valve 50 and, since valve 32 is closed, and valve 39 is open, the interior of the chamber is sprayed by the water. This spraying is done until the chamber is entirely wetted. Any water not absorbed by the aluminum deposit on chamber walls and interior accessories, drains through outlet 76, valve 77 and, through drains 66 and 63, into the pit 56 and then to the sewer. Then valve 50 is shut off. Valves 63 and 66 are closed. Valve 73 is opened and valve 32 is opened. The blower 19 is turned on. Then the pump 34 is started and it pumps the caustic solution from tank 29 through the spray head into the chamber 11. As the caustic solution acts on the aluminum deposit, the hydrogen generated is exhausted to outdoors by the blower 19. The caustic acts on the aluminum, creating a sludge which drains through the pipe 76, valve 77 and valve 73 into the caustic holding tank 29. This process continues with recirculation of the caustic as long as is needed to remove all of the aluminum deposits from the inside of the chamber. The time required for this will depend on the thickness of the deposit and the strength of the solution. It is typically done at room temperature. The only anticipated increase in temperature is whatever results from the chemical reaction.

When the removal of the deposits has been completed, the pump is stopped and valve 32 is closed. Valve 73 is closed and valve 74 is opened. Then valve 31 is opened and the pump is started. The neutralizer solution is thereby pumped from neutralizer holding tank 28 and sprayed throughout the chamber for a sufficient period to neutralize all of the caustic that might remain in the chamber. Drainage is accomplished through valve 74 into the tank 28 so that the neutralizing fluid is recirculated through tank 28.

When the neutralizing step has been completed, the pump is shut off and valve 31 is closed. Valve 50 is opened to again admit city water to spray and rinse the interior of the chamber. The spraying is done until the complete removal of the neutralizer has been accomplished. The rinse water is drained into the neutralizer holding tank 28. When that step is completed, the water valve 50 is closed. The blower 19 is shut off, and the hose 17 is disconnected from the chamber door. Since the hose is flexible, the chamber door can be opened with the hose still connected. This can be done if it is desired to check to make sure that all deposits have been removed. If they have, the hose 17 is then disconnected. The cleaning personnel can then enter the chamber and mop or wipe out any remaining water. Any puddles that might remain in any crevices or the like can be removed by an electric vacuum cleaner capable of handling wet material. The chamber itself should be completely drained because it is mounted with a three-degree slope toward the three inch diameter bottom outlet 76 at the rear of the chamber.

When all of the final drying details have been completed, the spray head 41 is removed and the nipple is plugged. Similarly, the plugs (not shown) in the vacuum line from the diffusion pump and the roughing pump and other openings to the chamber can be removed. Any additional accessories can be reinstalled in the chamber, whereupon it is ready again for vacuum metallizing operations.

The valves 39 and 77 are stainless steel ball valves of very high quality, so are able to tolerate the caustic environment during the cleaning operations, but still function and adequately seal the chamber under the high vacuum conditions during the vacuum metallizing operations.

Following the cleaning process, the liquid in the caustic holding tank 29 can be pumped to the settling tank 44. Valves 39, 77 and 74 are closed, as is valve 31. Valves 32 and 45 and 70 are open. Valves 49, 51, 52 and 54 are closed. When pumped into the settling tank, the caustic material can remain there for a prolonged period of time until shortly before the next cleaning operation is to be performed. Meanwhile, the sludge will settle to the bottom. Then, when the next cleaning operation is to be performed, the clear fluid can be taken from whichever of the two outlets 67 and 68 is appropriate, depending upon the fluid level and sludge level in the tank, and clear fluid is drained into the caustic holding tank 29 through the valve 73.

Although the drawing shows the settling tank as smaller than the caustic holding tank 29, this is only to conserve space in the drawing. Each of the caustic and neutralizer holding tanks 29 and 28, respectively, can hold from 80 to 100 gallons of material. Normally they are not kept any more than three-quarters full. In contrast, the settling tank may have a 250 gallon capacity. It may contain about 180 gallons after two or three cleanings of the chamber 11, if none of the caustic is re-used.

The initial preparation of the caustic solution is typically done in the tank 29. An example of caustic is Oakite 160 of Oakite Products Company, Inc., Berkley Heights, N.J. It is a chelated alkaline material. The preferred solution is six ounces of Oakite 160 material per gallon of water. The neutralizer used is preferably Oakite Enprox 702, also manufactured by the same company. It is an acidic material and the preferred mixture is one gallon of Enprox to two gallons of water. The water can be obtained from the city water supply through a hose (not shown).

The immersion tanks 46, 47 and 48 can be used for caustic, neutralizer, and rinse water, respectively. If tank 46 is used for caustic, a caustic solution of the same strength as in the tank 29 can be prepared, simply obtaining city water from a hose and mixing the Oakite powder in the tank, until the ph value is as desired.

The system is arranged such that, if desired, the various tanks can be pumped or drained to the sewer. Before doing that, addition of appropriate neutralizers and dilutions suitable for disposal in the public sewers, must be done, but this can be readily achieved with the arrangement provided according to this invention.

The three immersion tanks are typically of 240 gallon capacity each and are two feet wide and two feet deep and eight feet long. They can be used to clean with caustic, neutralize with neutralizer, and rinse various items such as the evaporator assembly, magazine assemblies, and the like, from previous production runs, while the chamber is in production with a new run. The fresh water supply, whether through the valve 50 to the spray head, or added to the tanks from a hose, would have a back-flow preventer to prevent any chance of contamination getting into the city water supply.

The exhaust fan 19 is of all Nalgene construction with an explosion proof motor of one-third horsepower, 1,725 RPM, 800 CFM at one inch static pressure of water with an eight inch diameter PVC duct from the chamber through the building roof to the outside. Condensed accumulated alkaline mist is drained from the fan housing through the line 78 back into the caustic holding tank 29.

Although not shown herein, in the practice of the invention, a four-position, key-operated main switch makes the cleaning system operational if the vacuum systems have been cleared in the respect that there is no vacuum in the chamber, all vacuum valves are closed, the air inlet valve is open, all mechanical pumps are off, and the diffusion pump is off. With adequate protection for it, the diffusion pump can be left on with the holding pump running. This would allow the unit to be fully operational as the chamber is cleaned and the water vacuumed off from the inside of the chamber by means of the vacuum cleaner handling wet areas.

As soon as the eight inch diameter flexible hose 17 is connected to the observation glass opening, the exhaust fan is started. At that time also, for the cleaning process, the circulating pump 34 can be started. An example of the detailed cleaning procedure is as follows:

Preparation to Clean the Chamber:

1. Remove all accessories inside chamber 11 which are made from aluminum, such as, feed through inserts, plugs, plates, sensor tubes.

2. Plug up openings which have a valve with aluminum cast plate or frame.

3. Mount in top of chamber the water spreader 41 to wet out the entire chamber while etching, neutralizing or rinsing.

4. Prepare caustic solution; add to the 60 gallons of water in the caustic-holding-tank, 3 to 6 ounces of caustic per gallon of water to establish a ph of about 14.

5. Prepare the neutralizing holding tank solution to establish a ph of about 4.

6. Open valves 39 and 77. Whenever settings and resetting of valves are required, check and double check carefully, that all valves are properly set.

7. Close chamber door and seal bottom section with C-clamps (2).

8. Turn exhaust fan on.

9. Open valve 50 to wet out the chamber area with water, and let it gravity flow into sump 56 by opening valves 66 and 63. Let it run and soak in for 3 minutes. Shut water off by closing valve 50.

Chamber Cleaning:

10. Turn on chemical pump 34. Check if exhaust fan is on. Check that all valves are properly set and caustic solution is flowing back to caustic holding tank. After 2-5 minutes, depending on concentration, the recycling solution will start to carry back dissolved aluminum to holding tank 29. Run for 20 minutes.

11. If it becomes necessary to check the progress inside the chamber, turn off chemical pump. Let all caustic solution return from chamber to caustic holding tank. Leave valves 39, 73, 77 open. Open valve 50 to rinse and wash chamber out with water. After chamber is rinsed out, approximately 2-3 minutes, open door 14. Observe progress, make any spray head outlet corrections, note whatever needs to be changed for next cleaning, (increase time, solution, strength, general cycle time), close and clamp door and return pump to operation to continue etching or, if all deposits had been removed, switch valves 73, 32, 74 and 31, to neutralize, Then, after 5 to 10 minutes neutralizing, turn off pump, close valve 31, open valve 50 and rinse.

12. After chamber is clean and all solutions are drained out, close top and bottom valves 39 and 77. Open chamber door, remove all water accumulation with a vacuum cleaner built to handle wet matter ("wet vac").

Prepare to Resume Production:

13. Remove all attachments and plugs; reinstall previously removed accessories and sight glass. Insert metallizing carriage with evaporator. Close door and evacuate chamber. Run roughing pump on gas ballast for 10 to 15 minutes. Close gas ballast valves. Evacuate chamber to 100 microns and then switch over to diffusion pump. Fire at $1 \times 10^{-4}$ torr, one or two pins to pre-coat chamber walls.

One man can have the chamber cleaned and the metallizer ready for production within 1½ hours. This is about one-fourth the time it takes to clean by conventional procedures. To clean the chamber with the metallizing carriage in it, may add additional 30 minutes. To clean with the fixture racks on carriage, may add additional 30 minutes.

All piping, including valves, elbows, tees, reducers, adaptors, nipples and unions are highly corrosion resistant material (e.g. PVC, polypropylene or Nalgene) and conform with schedule 80 threaded connections, to allow a solid and professional assembly (¾" dia., 1" dia., 1½" dia., 3" dia. sizes). The pump 34 which circulates the caustic solution as well as the neutralizer to various destinations, is a magnetic disk-pump, fully chemically resistant to solvents used. Pump specifications: 53 gal./min., 3,450 RPM, ¾ HP, 1½ dia. inlet, 1" dia. outlet. The plastic piping is connected to the vacuum chamber in two locations. On the top, it is the 1½" dia. pressure line through the 1½" stainless steel ball-valve 39 to spray the solution into the chamber. On the bottom of the vacuum tank is a 3" motorized stainless-steel ball-valve 77 to connect the system to the gravity-drain, allowing a recirculating set-up using only the one pump 34.

The frequency of cleaning will depend on the number of depositions and thickness of deposit per deposition. An optimum frequency can be determined based on color of deposits and pump-down time. With modern depositing processes, thickness as great as 50 angstroms can be deposited per load of articles coated.

Since the chamber is physically a closed entity during the cleaning operation, and nobody is inside at any time during the cleaning, there is no chance of anybody being splashed or otherwise exposed to any chemical burns from the cleaning liquid used.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. In combination with a vacuum metallizer including a vacuum metallizing chamber in which products are placed and vacuum metallized, the chamber having pumping means capable of providing a vacuum of $2 \times 10^{-4}$ torr in said chamber the improvement comprising;
   cleaning liquid distributor means inside the chamber;
   cleaning liquid drain means at the bottom of the chamber;
   cleaning liquid holding means outside the chamber;
   and cleaning liquid recirculating conduit means coupled from said drain means to said holding means and from said holding means to said distributor means said holding means being a caustic holding tank at a level below said chamber, and the drain means being an outlet with a chamber drain valve;
   the improvement further comprising;
   a chamber supply valve at the chamber and coupled to said distributor means;
   a pressure line from a location adjacent the tank to the chamber supply valve;
   a drain line from the drain valve;
   a first drain line branch from the drain line to the caustic holding tank;
   a pump in the pressure line; and
   a valved caustic-inlet line to the pump from the caustic holding tank.

2. The improvement of claim 1 and further comprising:
   a neutralizer holding tank beside said caustic holding tank;
   a valved neutralizer-inlet line to the pump from said neutralizer holding tank; and
   a second drain line branch from the drain line to the neutralizer holding tank.

3. The improvement of claim 2 and further comprising:
   first and second valves in said first and second drain line branches, respectively.

4. The improvement of claim 3 and further comprising:
   a fresh water line with valve coupled to said pressure line between said pump and the chamber supply valve.

5. The improvement of claim 3 and further comprising:
   a settling tank;
   a second pressure line from the pump to the settling tank; and
   a valved return line from the settling tank to the caustic-holding tank.

6. The improvement of claim 5 and further comprising:
   immersion tanks coupled to said second pressure line.

7. In combination with a vacuum metallizer including a vacuum metallizing chamber in which products are placed and vacuum metallized, the chamber having pumping means capable of providing a vacuum of $2 \times 10^{-4}$ torr in said chamber, the improvement comprising;
   cleaning liquid distributor means inside the chamber;
   cleaning liquid drain means at the bottom of the chamber;
   cleaning liquid holding means outside the chamber;
   and cleaning liquid recirculating conduit means coupled from said drain means to said holding means and from said holding means to said distributor means; the improvement further comprising:
   a chamber drain valve in said liquid drain means; and
   a chamber supply valve coupled to said distributor means, said valves being immune to attack by caustic, and capable of excluding atmosphere from the interior of said chamber at $10^{-4}$ torr to $10^{-6}$ torr during vacuum metalizing operations.

8. The improvement of claim 7 wherein:
   the chamber is at least 60 inches inside diameter and at least 72 inches long and has a door extending entirely across one end.

* * * * *